United States Patent
Kerkman et al.

(10) Patent No.: US 9,651,592 B2
(45) Date of Patent: May 16, 2017

(54) IMPEDANCE DETECTOR APPARATUS AND METHOD

(71) Applicants: Russel J. Kerkman, Milwaukee, WI (US); Ahmed Mohamed Sayed Ahmed, Mequon, WI (US); Brian J. Seibel, Grafton, WI (US); Shiv Gupta, Milwaukee, WI (US); Prathamesh Ramesh Vadhavkar, Brown Deer, WI (US)

(72) Inventors: Russel J. Kerkman, Milwaukee, WI (US); Ahmed Mohamed Sayed Ahmed, Mequon, WI (US); Brian J. Seibel, Grafton, WI (US); Shiv Gupta, Milwaukee, WI (US); Prathamesh Ramesh Vadhavkar, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 587 days.

(21) Appl. No.: 14/095,169

(22) Filed: Dec. 3, 2013

(65) Prior Publication Data

US 2015/0153397 A1    Jun. 4, 2015

(51) Int. Cl.
*G01R 27/02* (2006.01)
*G01R 27/08* (2006.01)
*G01R 31/02* (2006.01)
*G01R 31/42* (2006.01)

(52) U.S. Cl.
CPC .......... *G01R 27/02* (2013.01); *G01R 31/028* (2013.01); *G01R 31/42* (2013.01)

(58) Field of Classification Search
CPC ................................ G01R 27/02; G01R 31/42

USPC ........................................................... 702/65
See application file for complete search history.

(56) References Cited

U.S. PATENT DOCUMENTS

| | | | |
|---|---|---|---|
| 4,419,621 A | 12/1983 | Becker | |
| 4,697,930 A * | 10/1987 | Roberts | ................. G04G 19/00 345/211 |
| 4,721,916 A | 1/1988 | Hanasawa | |
| 4,935,692 A * | 6/1990 | Wakasugi | ............. G01R 27/02 324/123 C |
| 5,319,513 A | 6/1994 | Lowenstein et al. | |
| 5,491,725 A | 2/1996 | White | |

(Continued)

FOREIGN PATENT DOCUMENTS

| | | |
|---|---|---|
| CN | 1558253 A | 12/2004 |
| CN | 201393056 Y | 1/2010 |

(Continued)

OTHER PUBLICATIONS

Bhattacharya, "Basic Electrical and Electronics Engineering", Aug. 18, 2011, 10 pgs.

(Continued)

*Primary Examiner* — John Breene
*Assistant Examiner* — Mohammad Islam
(74) *Attorney, Agent, or Firm* — Fay Sharpe LLP (57) ABSTRACT

Impedance detection methods and systems are presented for automatic computation of an electrical component impedance value at one or more specific frequencies of interest using quadrature voltage and current values generated by quadrature tracking filters based on sensed or measured voltage and current signals or values and a base frequency input.

18 Claims, 6 Drawing Sheets

(56) References Cited

U.S. PATENT DOCUMENTS

| | | |
|---|---|---|
| 5,796,258 A | 8/1998 | Yang |
| 5,804,973 A | 9/1998 | Shinohara |
| 5,931,836 A * | 8/1999 | Hatta ................. A61B 18/1206 606/34 |
| 6,002,238 A | 12/1999 | Champlin |
| 6,166,929 A | 12/2000 | Ma et al. |
| 6,269,010 B1 | 7/2001 | Ma et al. |
| 6,366,483 B1 | 4/2002 | Ma et al. |
| 6,525,951 B1 | 2/2003 | Paice |
| 6,642,689 B2 | 11/2003 | Ishida et al. |
| 6,667,866 B1 | 12/2003 | LaPlace |
| 7,274,576 B1 | 9/2007 | Zargari et al. |
| 7,309,973 B2 | 12/2007 | Garza |
| 7,495,410 B2 | 2/2009 | Zargari et al. |
| 7,495,938 B2 | 2/2009 | Wu et al. |
| 7,511,976 B2 | 3/2009 | Zargari et al. |
| 7,602,127 B2 | 10/2009 | Coumou |
| 7,616,005 B2 | 11/2009 | Kalyuzhny et al. |
| 7,683,568 B2 | 3/2010 | Pande et al. |
| 7,764,523 B2 | 7/2010 | Conticelli et al. |
| 7,782,009 B2 | 8/2010 | Wiseman |
| 7,786,735 B2 | 8/2010 | Kalyuzhny et al. |
| 7,800,348 B2 | 9/2010 | Zargari |
| 7,812,615 B2 | 10/2010 | Gajic et al. |
| 7,818,137 B2 | 10/2010 | Agarwal |
| 7,990,097 B2 | 8/2011 | Cheng et al. |
| 8,009,450 B2 | 8/2011 | Royak et al. |
| 8,030,791 B2 | 10/2011 | Lang et al. |
| 8,044,631 B2 | 10/2011 | Dai et al. |
| 8,183,874 B2 | 5/2012 | Dommaschk |
| 8,259,426 B2 | 9/2012 | Xiao et al. |
| 8,259,480 B2 | 9/2012 | Hasler |
| 8,350,397 B2 | 1/2013 | Lang et al. |
| 8,352,203 B2 | 1/2013 | Seibel et al. |
| 8,395,910 B2 | 3/2013 | Alexander |
| 8,400,800 B2 | 3/2013 | Alexander |
| 8,587,160 B2 | 11/2013 | Dai et al. |
| 8,643,383 B2 | 2/2014 | Xiao |
| 8,648,610 B2 | 2/2014 | Mikami |
| 8,698,507 B2 | 4/2014 | Huang |
| 8,729,844 B2 | 5/2014 | Feng et al. |
| 2001/0017489 A1 | 8/2001 | Inoue et al. |
| 2004/0257093 A1 | 12/2004 | Sakiyama |
| 2005/0192765 A1* | 9/2005 | Slothers ................. G01D 5/12 702/57 |
| 2007/0043303 A1* | 2/2007 | Osypka ................. A61B 5/0535 600/547 |
| 2009/0048595 A1* | 2/2009 | Mihori ................ A61B 18/1206 606/49 |
| 2009/0072982 A1 | 3/2009 | Cheng et al. |
| 2010/0161259 A1 | 6/2010 | Kim et al. |
| 2011/0169462 A1* | 7/2011 | Andresen ................. H02J 3/18 323/212 |
| 2012/0095461 A1* | 4/2012 | Herscher ............ A61B 18/1492 606/45 |
| 2012/0271572 A1 | 10/2012 | Xiao |
| 2013/0057297 A1 | 3/2013 | Cheng |
| 2013/0076151 A1 | 3/2013 | Bae et al. |
| 2013/0120038 A1 | 5/2013 | Kerkman et al. |
| 2013/0120039 A1 | 5/2013 | Kerkman et al. |
| 2013/0279214 A1 | 10/2013 | Takase et al. |
| 2013/0286692 A1 | 10/2013 | Patel et al. |
| 2014/0012552 A1 | 1/2014 | Zik |
| 2014/0217980 A1 | 8/2014 | Malrieu |
| 2014/0320056 A1 | 10/2014 | Royak |
| 2014/0326340 A1* | 11/2014 | Kuriki ................. C23F 11/18 137/565.11 |
| 2015/0092460 A1 | 4/2015 | Tallam |
| 2015/0155794 A1 | 6/2015 | Long |
| 2015/0241503 A1 | 8/2015 | Bhandarkar |
| 2015/0263600 A1 | 9/2015 | Bhandarkar et al. |

FOREIGN PATENT DOCUMENTS

| | | |
|---|---|---|
| EP | 2299568 A1 | 3/2011 |
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO 2012/044737 A2 | 4/2012 |
| WO | WO2012110087 A1 | 8/2012 |
| WO | WO2012110088 A1 | 8/2012 |
| WO | WO 2013/038098 | 3/2013 |

OTHER PUBLICATIONS

Rodriguez-Valdez, et al., "Phase Locked Loop for Unbalanced Utility Conditions", 2010 Applied Power Electronics Conference and Exposition (APEC), 2010 25$^{th}$ Annual IEEE 2010, Piscataway, NJ, Feb. 21, 2010, pp. 634-641.

European Search Report, EP Appl. No. 14196030.2-1504, mailed Apr. 30, 2015, completed Apr. 22, 2015, 5 pgs.

European Search Report completed Jul. 20, 2015 for Application No. EP 15 15 6270.

ABB Bay Control REC670 Application manual, Relion 670 series, http://www05./abb.com/global/scot/scot354.nsf, Oct. 10, 2011, pp. 1-586 (2 parts).

Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).

"Protective Relays", iCP-630 Capacitor Bank Protection Relay, Cooper Power Systems, Jan. 2011, pp. 1-8.

ABB Distribution Automation Handbook, Section 8.10 Protection of Capacitor Banks, Mar. 5, 2011.

Ge C70 Capacitor Bank Protection and Control System UR Series Instruction Manual C70 Revision: 6.0x, Copyright @ 2011, GE Multilin, http://www.GEmultilin.com, pp. 1-644 (2 parts).

"iCP-630 Capacitor Bank Protection Relay", Cooper Power Systems, Mar. 2007.

U.S. Appl. No. 13/570,781, "Filter Capacitor Degradation Detection Apparatus and Method", by Patel et al., filed Aug. 9, 2012.

U.S. Appl. No. 13/872,177, "Active Front End Filter Capacitor Failure Prediction With Y and Delta Capacitor Connection", by Royak et al., filed Apr. 29, 2013.

U.S. Appl. No. 14/042,753, "Method and Apparatus for Detecting Afe Filter Capacitor Degradation", by Tallam et al., filed Oct. 1, 2013.

Lee, et al., "Online capacitance estimation of DC-link electrolytic capacitors for three-phase AC/DC/AC PWM converters using recursive least squares method", IEE Proc.-Electr, Power Appl., vol. 152, No. 6, Nov. 2005.

* cited by examiner

IMPEDANCE DETECTOR APPARATUS AND METHOD

BACKGROUND

Motor drives and other electrical systems include a variety of electrical components, such as capacitors, inductors, resistors, etc., often employed in filter circuits. For instance, active front-end rectifiers for motor drives and other power conversion systems often include LC or LCL filters with individual inductive and capacitive components. Performance of these input filters depends at least partially on provision of the designed device impedance value, wherein impedance changes and/or imbalance between corresponding components in multiphase power distribution systems can lead to adverse performance, including loss of efficiency, instability, increased noise, etc. In addition to motor drives and power conversion systems, electrical systems generally operate best when passive electrical component values are at their proper designed impedance values. Accordingly, diagnosing system performance issues often involves assessing the impedance values of various electrical components. Manual impedance measurement is often difficult and time-consuming, and previous in situ impedance measurement techniques suffer from computation complexity preventing or inhibiting real-time automatic device impedance scrutiny while the overall system is operating. Moreover, conventional measurement techniques may be incapable of measuring certain component impedance values under real-life operating conditions, such as inductor impedance during saturation. In addition, it is often desired to obtain impedance values corresponding to different frequencies, and conventional approaches often involve significant manual testing efforts and/or excessive computational overhead for Fourier analysis and the like. Accordingly, a need remains for improved methods and apparatus for determining the impedance of electrical components.

SUMMARY

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

Generalized impedance detection apparatus and techniques are disclosed by which the impedance of any passive electrical component can be accurately identified at any given frequency using the applied voltage and current flowing through the component. The concepts of the present disclosure may be employed in any electrical system, including without limitation motor drives and power converters, and may be implemented in any processor-based system such as in a motor drive or PLC or other industrial control device or supervisory host system for diagnostic and/or control purposes.

One or more aspects of the present disclosure involve methods and systems for automatically determining the impedance of an electrical component, in which quadrature voltage values and quadrature current values associated with the component are obtained at a frequency of interest, and one or more impedance values are computed at the frequency of interest according to the quadrature voltage and current values using one or more processors. The quadrature values can be obtained at a given frequency of interest using quadrature tracking filters with corresponding frequency inputs, as well as inputs receiving signals or values representing measured, estimated and/or observed voltages and currents associated with the component of interest. A PLL or other source may be used to provide an adjustable frequency input to the tracking filters to facilitate measurement of component impedance at multiple frequencies of interest. The various embodiments can be used to assess impedances of banks of capacitors or inductors associated with multiphase systems, and may involve converting one or more detected voltage or current signals to accommodate various in-line, line-line and/or line-neutral connections of components and sensors. Further aspects of the disclosure provide non-transitory computer readable mediums with computer executable instructions for performing the disclosed impedance detection methods.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Referring now to the figures, several embodiments or implementations are hereinafter described in connection with the drawings, wherein like reference numerals are used to refer to like elements throughout, and wherein the various features are not necessarily drawn to scale.

Figure 1A:
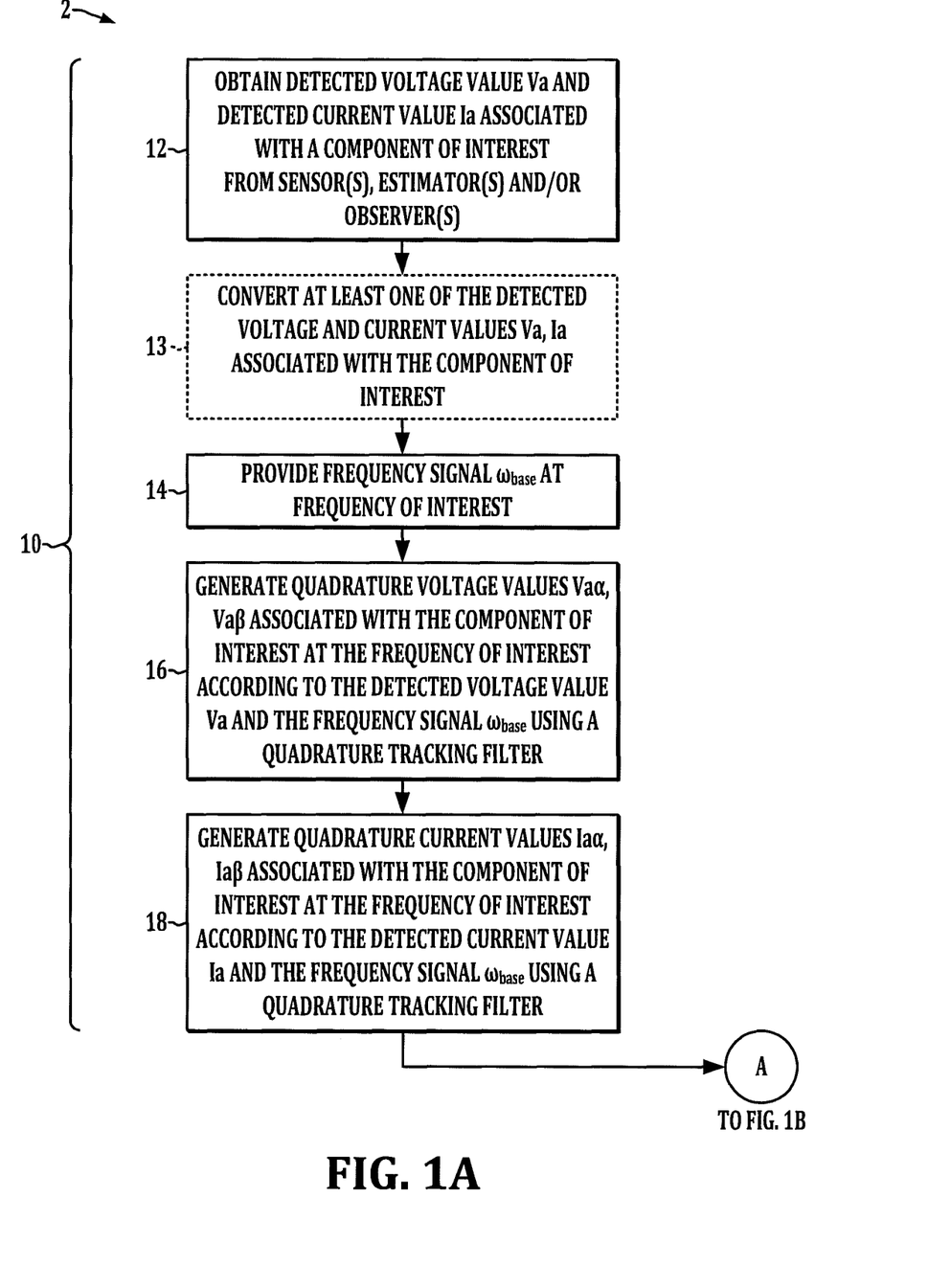
FIGS. 1A and 1B provide a flow diagram illustrating an exemplary method for determining an electrical component impedance in accordance with one or more aspects of the present disclosure.
Figure 1B:
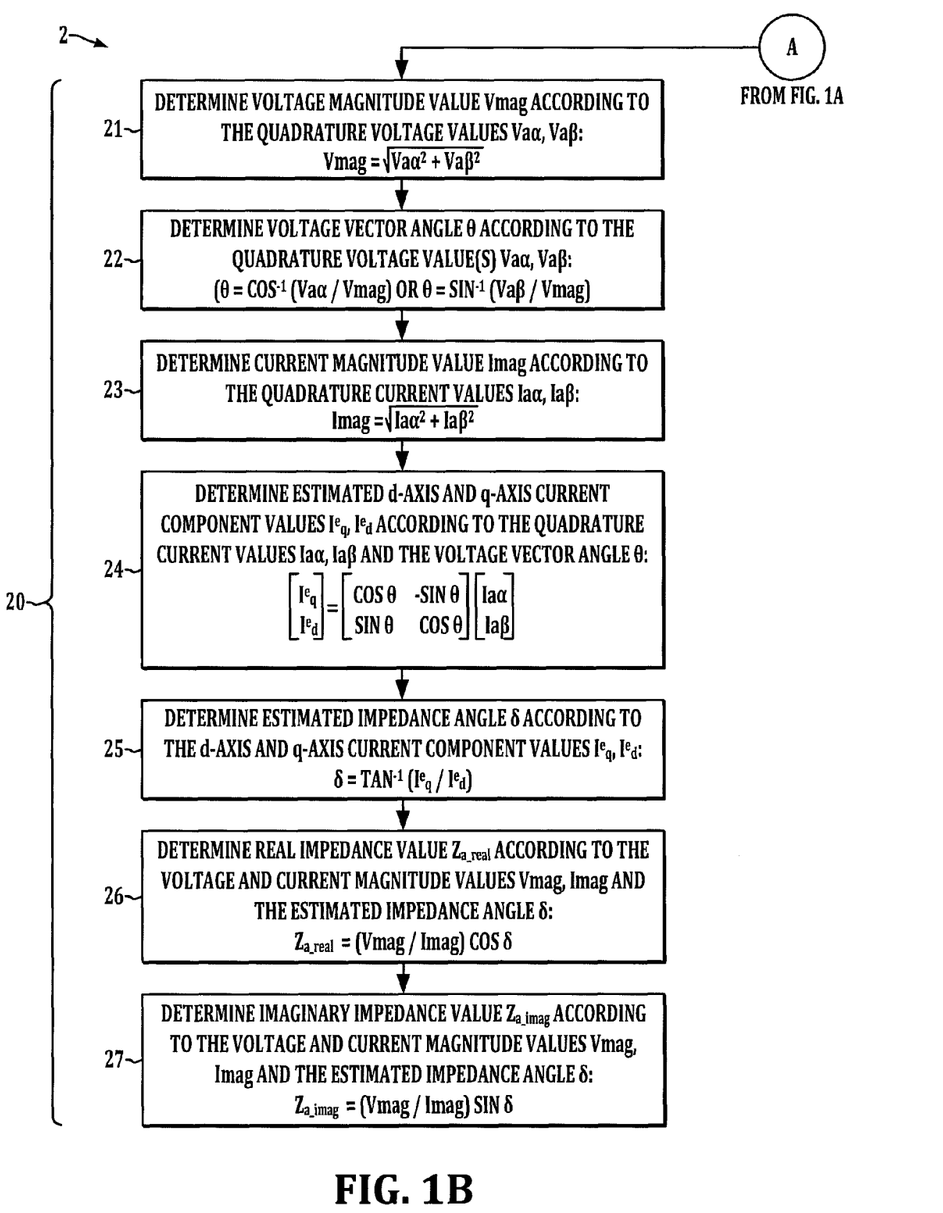
Figure 2:
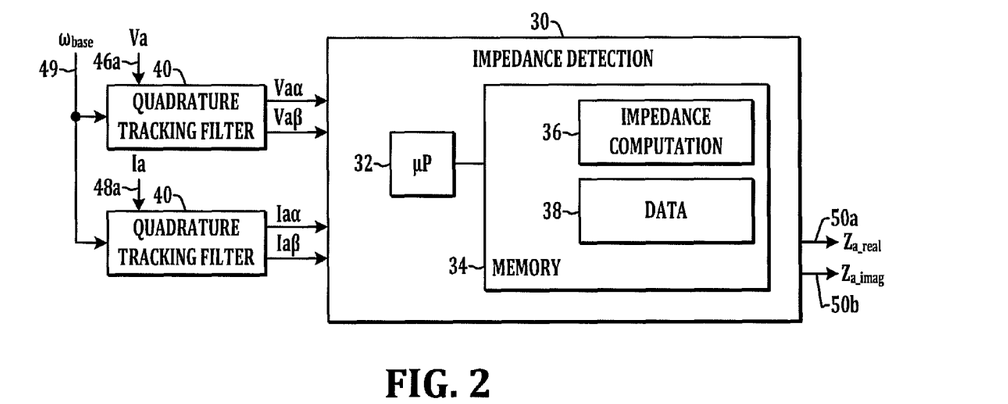
FIG. 2 is a schematic diagram illustrating an exemplary processor-implemented impedance detection system receiving quadrature inputs from tracking filters and providing real and imaginary impedance output values in accordance with further aspects of the disclosure.

Referring initially to FIGS. 1A, 1B and 2, an exemplary process 2 is illustrated in FIGS. 1A and 1B for automatically determining the impedance of one or more electrical components in accordance with one or more aspects of the present disclosure. Although the exemplary method 2 is depicted and described in the form of a series of acts or events, the methods of the disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software, or combinations thereof, in order to provide automated impedance value estimation as described herein, and various embodiments or implementations include non-transitory computer readable mediums having computer-executable instructions for performing the illustrated and described methods. For example, the method 2 may be implemented by a microprocessor 32 of an impedance detection system 30 illustrated in FIG. 2 using program instructions for impedance computation 36 and various data 38 stored in an electronic memory 34 based on inputs from quadrature tracking filters 40 to provide impedance estimate values 50*a* and 50*b*, although the method 2 can be implemented in other systems, including without limitation those illustrated and described herein.

The process 2 of FIGS. 1A and 1B generally provides for obtaining quadrature voltage values at 10 (FIG. 1A) for voltages and currents associated with the electrical component of interest, as well as computing at least one impedance value at 20 (FIG. 1B). The impedance detection system 30 of FIG. 2 includes a microprocessor 32 programmed with impedance computation instructions 36 stored in an electronic memory 34 for performing the impedance value computations at 20 in FIG. 1B. The impedance detection system 30 may be implemented as any suitable single or multi-processor system, programmable logic, or other circuitry or combinations thereof, and may include an electronic memory 30 or other non-transitory computer readable medium for storing computer executable instructions for performing the impedance detection functionality set forth herein. The system 30, moreover, can be integrated into an electrical system, such as a motor drive 110 or programmable logic controller (PLC) 170 or other industrial control device in certain non-limiting embodiments as illustrated and described below in connection with FIG. 4.

In the example of FIG. 2, the impedance detection system 30 receives quadrature voltage values Vaα and Vaβ from a first quadrature tracking filter 40 as well as quadrature current values Iaα and Iaβ from another quadrature tracking filter 40, where the quadrature voltage and current values are associated with an electrical component of interest and are associated with a specific base frequency or frequency of interest 49 ($\omega_{base}$). In this implementation, the quadrature tracking filters 40 receive corresponding detected voltage and current signals or values 46*a* (Va) and 48*a* (Ia) associated with the electrical component of interest, where the signals or values 46 and 48 can be received from any suitable sensor, estimator, observer, or the like. For instance, in the case of an inductor or capacitor of an active front end input filter circuit, various voltages and currents can be sensed at certain locations in the filter circuit, and these can be optionally processed to generate signals or values 46, 48 representing the voltage across the inductor or capacitor of interest as well as the current flowing through that component. The first quadrature tracking filter 40 in this case generates the quadrature voltage values Vaα and Vaβ according to the detected voltage signal or value Va 46*a* and also and according to the frequency signal or value 49 ($\omega_{base}$). Similarly, the second quadrature tracking filter 40 in FIG. 2 generates the quadrature current values Iaα and Iaβ according to the detected current signal or value Ia 48*a* and according to the frequency signal or value 49. The quadrature voltage values (e.g., Vxα, Vxβ) provided by the first quadrature tracking filter 40 represent 90° phase shifted values representing the detected voltage 46*a* at the base frequency $\omega_{base}$, and similarly the quadrature current values Iaα and Iaβ represent the detected current signal or value 48*a* and are phase shifted by 90° relative to one another.

Figure 5:
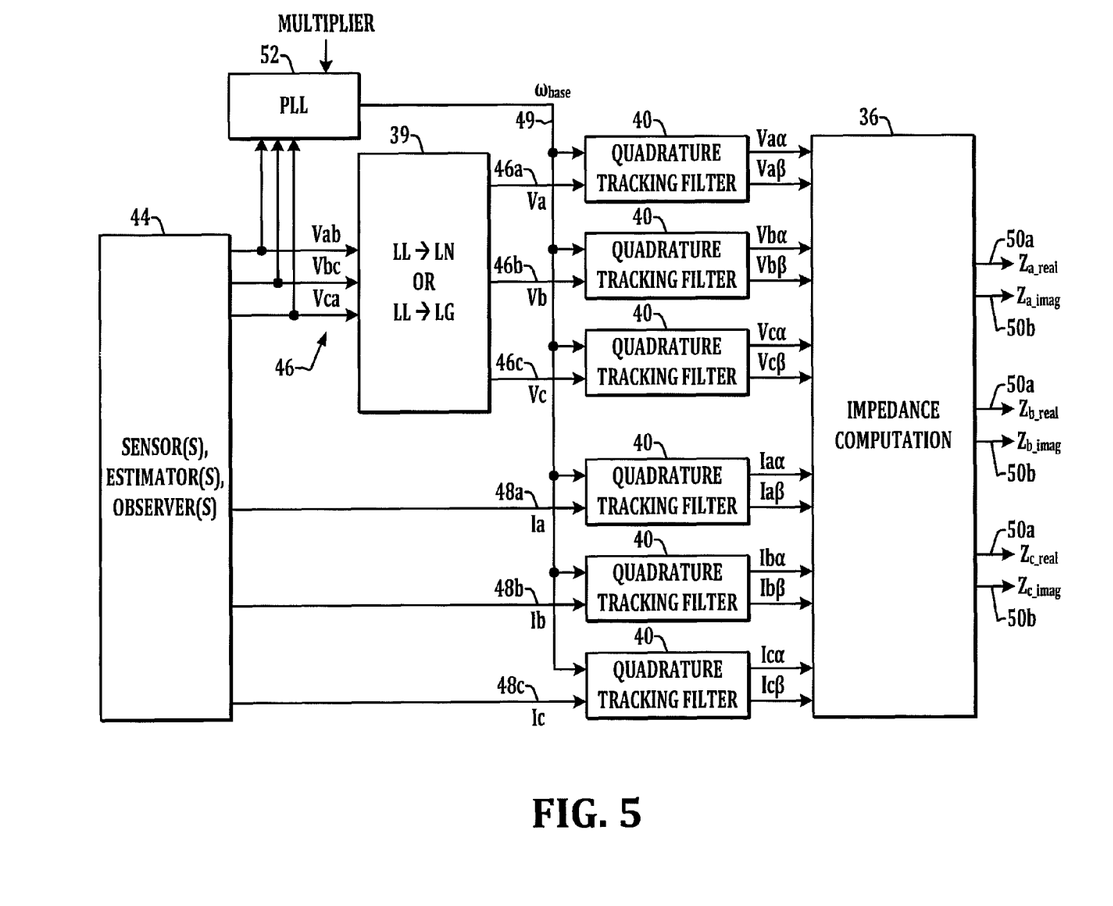
FIG. 5 is a schematic diagram illustrating another exemplary impedance detection system embodiment with in accordance with the present disclosure.
Figure 6:
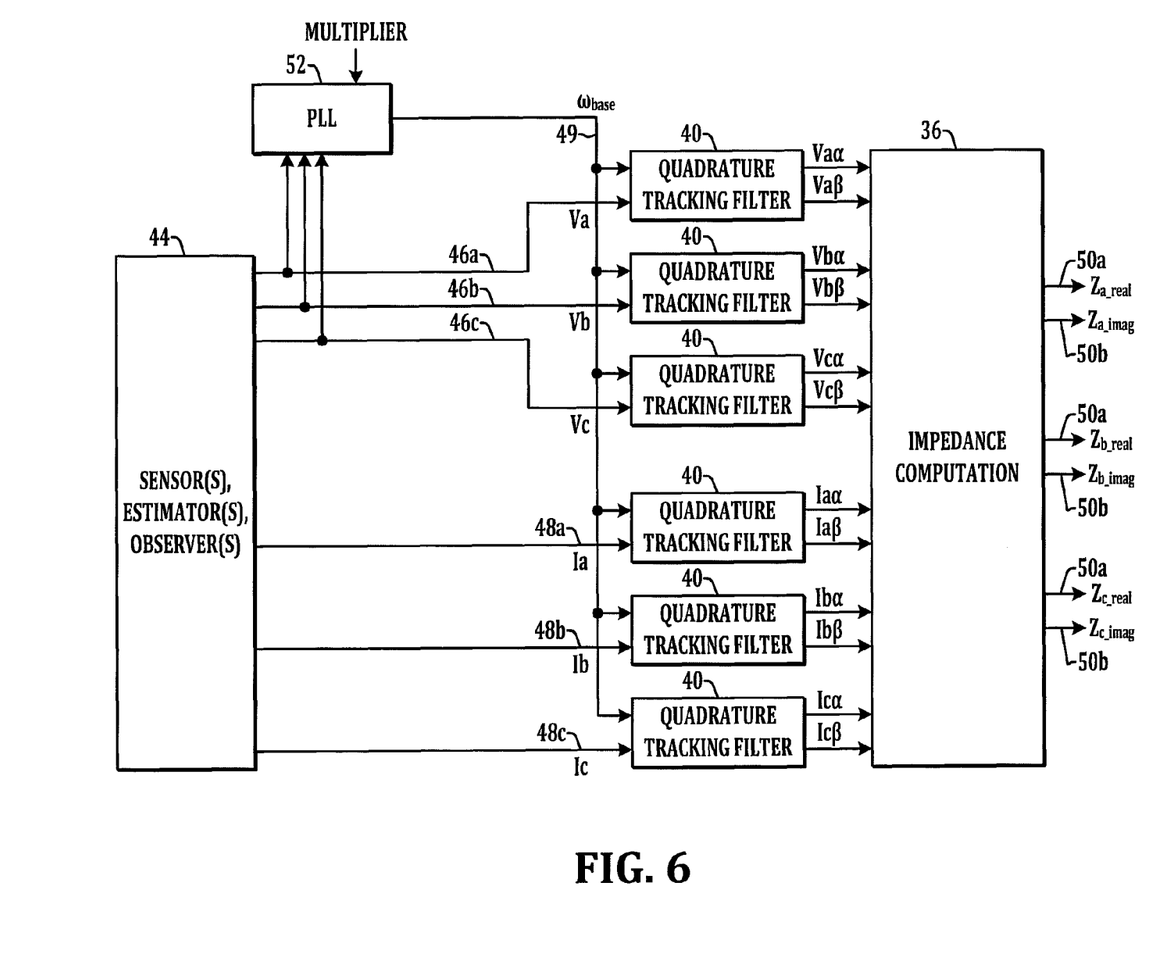
FIG. 6 is a schematic diagram illustrating another impedance detection system embodiment in accordance with the present disclosure.

Any suitable quadrature tracking filters 40 can be used in accordance with the present disclosure, non-limiting suitable examples of which are illustrated and described in US patent application publication number 2013/0120038 A1 to Kerkman et al., published May 16, 2013, and assigned to the assignee of the present application, the entirety of which is hereby incorporated by reference. As seen in FIG. 2, moreover, the base frequency signal 49 may be provided by any suitable source, including a digital value representing the base frequency 49 provided by the impedance detection system 30 and/or another component of a larger system, such as a motor drive controller, a PLC, network server, etc., or an analog base frequency signal 49 can be provided by any suitable source including the impedance detection system 30, a phase locked loop (PLL) circuit (e.g., as shown in FIGS. 5 and 6 below), or other suitable source. This, in turn, allows selective estimation of the electrical component impedance at one or more frequencies of interest, and may facilitate assessment of electrical components by service personnel and/or by diagnostic components implemented in a power conversion system, distributed industrial control system, or other host system.

Figure 3:
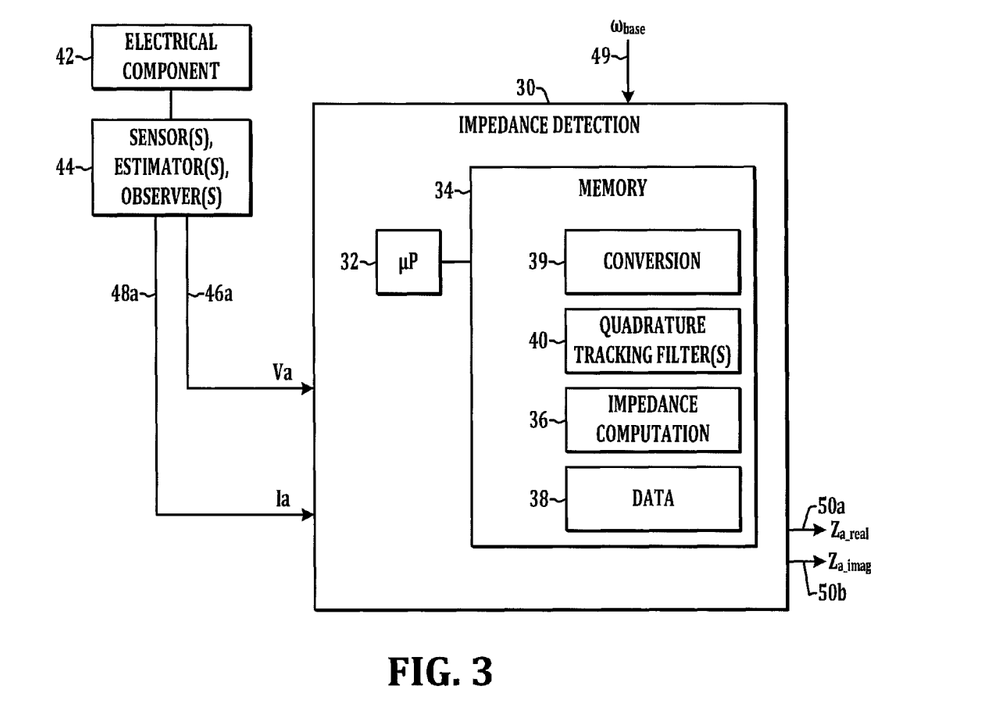
FIG. 3 is a schematic diagram illustrating another impedance detection system embodiment with a processor implementing quadrature tracking filters and impedance computation features to provide impedance output values.

As further shown in FIG. 3, moreover, other embodiments of the impedance detection system 30 may directly interface with sensors, estimators and/or observers 44 to directly receive the signals and/or values 46 and 48 respectively representing the voltage across, and the current through, a particular electrical component 42. In this non-limiting embodiment, the processor 32 of the impedance detection system 30 implements the quadrature tracking filters 40, for example, using computer executable instructions stored in the electronic memory 34 for implementation by the processor 32 to determine the quadrature voltage values Vaα, Vaβ and the quadrature current values Iaα, 14 according to the respective input signals or values 46, 48 and the signal or value 49 representing the frequency of interest $\omega_{base}$. As set forth in US patent application publication number 2013/0120038 A1, incorporated herein by reference, moreover, various implementations may employ a single input, multiple output tracking filter 40, or one or more multiple input, multiple output tracking filters 40 may be used, whether implemented separately from the impedance detection system 30 (e.g., FIG. 2), or integrated therein (FIG. 3).

Returning to FIG. 1A, the illustrated implementation of the process 2 includes the quadrature tracking filters 40 respectively obtaining the detected voltage value 46*a* and the detected current value 48*a* associated with the electrical component 42 from a suitable source at 12, such as one or more sensors, estimators and/or observers 44. At 13 in FIG. 1A, moreover, one or more of the detected voltage and current values associated with the component of interest 42 may be optionally converted, for example, to implement conversion between measured line-line voltage values and line-neutral voltage values (e.g., see FIG. 5 below). At 14 in FIG. 1A, a frequency signal 49 (e.g., $\omega_{base}$) is provided, which indicates a particular frequency of interest. At 16, the quadrature voltage values Vaα and Vaβ are generated according to at least one detected voltage signal or value Va associated with the electrical component 42 and according to the frequency signal or value $\omega_{base}$ using a first quadrature tracking filter 40. Similarly at 18, the quadrature current values Iaα and Iaβ are generated according to at least one detected current signal or value Ia associated with the electrical component 42 and according to the frequency signal or value $\omega_{base}$ 49.

One embodiment of the impedance value computation 20 is illustrated in FIG. 1B, which may be implemented by the processor 32 of the detection system 30 executing instructions of the impedance computation component 36 stored in the memory 34. In this example, the processor 32 computes one or more impedance values 50 at 20 (such as a real component 50a ($Z_{a\_real}$) and/or an imaginary component 50b ($Z_{a\_imag}$)) associated with the electrical component 42 at the base frequency $\omega_{base}$ according to the quadrature voltage and current values Vaα, Vaβ, Iaα and Iaβ. At 21 in FIG. 1B, the processor 32 computes a voltage magnitude value Vmag as a square root of a sum of squares of the quadrature voltage values Vaα and Vaβ, and computes a voltage vector angle θ at 22 based on one of the quadrature voltage values Vaα, Vaβ and the voltage magnitude value (Vmag as θ=cos$^{-1}$(Vaα/Vmag) or θ=sin$^{-1}$(Vaβ/Vmag)). A current magnitude value Imag is computed at 23 as a square root of a sum of squares of the quadrature current values Iaα and Iaβ, and estimated d-axis and q-axis current component values $I^e_d$ and $I^e_q$ are computed at 24 based on the quadrature current values Iaα, Iaβ and a voltage vector angle θ, using the following formula:

$$\begin{bmatrix} I^e_q \\ I^e_d \end{bmatrix} = \begin{bmatrix} \cos\theta & -\sin\theta \\ \sin\theta & \cos\theta \end{bmatrix} \begin{bmatrix} Ia\alpha \\ Ia\beta \end{bmatrix}$$

At 25 In FIG. 1B, an estimated impedance angle δ is computed according to the estimated d-axis and q-axis current component values $I^e_d$ and $I^e_q$ as δ=tan$^{-1}$ ($I^e_q/I^e_d$), and the real and imaginary impedance values 50a ($Z_{a\_real}$) and 50b ($Z_{a\_imag}$) are computed at 26 and 27 according to the voltage and current magnitudes Vmag, Imag and the angle δ using the following formulas:

$Z_{x\_real}$=(Vmag/Imag)cos(δ); and $Z_{x\_imag}$=(Vmag/Imag)sin(δ).

The process 2 may be repeated for one or more further electrical components in a given system, and/or the base frequency signal or value 49 ($\omega_{base}$) may be adjusted one or more times in order to estimate the component impedance(s) at different frequencies of interest. For example, a supervisory control component may selectively adjust the frequency signal or value 49 provided to the quadrature tracking filters 40, with the processor 32 executing the impedance computation component 36 again to obtain a different set of frequency-specific real and imaginary impedance values 50a and 50b for various frequencies of interest. This, in turn, allows diagnosis of the relative health of a given electrical component 42 of interest. Moreover, the system 30 and the process 2 may be used to ascertain the impedance 50 of multiple components of a given system, at one or more frequencies of interest, in order to allow comparison of multiple electrical components 42.

Figure 4:
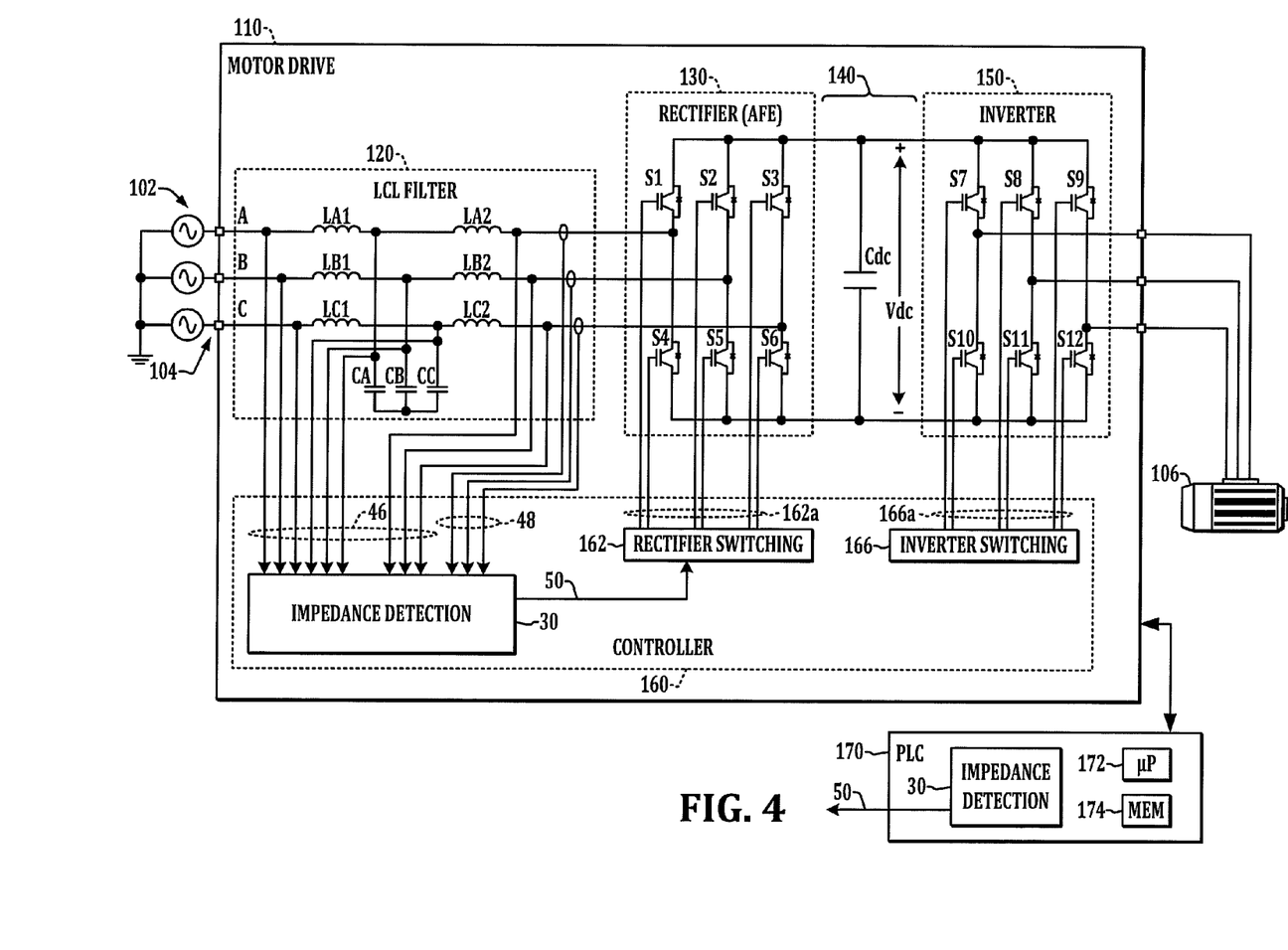
FIG. 4 is a schematic diagram illustrating an exemplary motor drive power conversion system implementing an impedance detection system according to the present disclosure in a motor drive controller, as well as an alternate implementation in a connected programmable logic controller.

Referring also to FIGS. 4 and 5, for example, it may be desirable to determine inductance values associated with multiple inductors of an active front end input filter circuit 120 in a motor drive 110 or other power conversion system, in order to assess imbalance conditions, where the inductors L associated with different power phases ideally have the same or similar inductance values at one or more frequencies of interest. FIG. 4 illustrates an exemplary motor drive 110 receiving three-phase electrical input power from a power source 102 via input terminals 104 connected to an input filter 120. The motor drive 110 in this example includes an active front end (AFE) rectifier 130 with switching devices S1-S6 operated according to switching control signals 162a from a rectifier switching control component 162 of a motor drive controller 160 to convert AC power received through the input filter 120 into DC power to provide a DC bus voltage Vdc across a capacitor Cdc of an intermediate DC bus circuit 140. The DC bus voltage is provided as an input to an inverter 150 having switching devices S7-S12 operated according to inverter switching control signals 166a from an inverter switching component 166 of the controller 160. In operation, the inverter 150 converts DC input power to create variable frequency, variable amplitude AC output signals to drive a motor load 106 connected as shown.

In the example of FIG. 4, an LCL filter 120 is connected between the motor drive AC input terminals 104 and the input terminals of the rectifier 130, and includes an LCL configuration for each of three input phases A, B and C. In this particular example, 3% inductors LA1, LB1 and LC1 are individually connected between the input nodes and a corresponding filter intermediate node, and 9% inductors LA2, LB2 and LC2 are connected between the corresponding filter intermediate nodes and the inputs of the rectifier 130. In this configuration, moreover, the filter 120 also includes filter capacitors CA, CB and CC individually connected between a corresponding one of the intermediate filter nodes and a common neutral point connection, which may, but need not, be connected to a power system neutral or ground. In this regard, the first set of inductors LA1, LB1 and LC1 are typically of identical inductance values, as are the second set of inductors LA2, LB2 and LC2. Likewise, the capacitors CA, CB and CC of the filter circuit 120 are preferably of the same capacitance values. Moreover, imbalance in the inductance values of the filter inductors and/or imbalances in the capacitance values of the filter capacitors may lead to inefficient or undesirable operation of the motor drive 110.

As seen in FIG. 4, the impedance detection system 30 may be implemented using a processor and associated electronic memory of the motor drive controller 160, wherein the controller 160 may include one or more processors and associated memory. In this case, the controller 160 also implements the rectifier and inverter switching control functions according to known switching control principles. In addition, the controller 160 receives voltage feedback signals or values 46 as well as current feedback signals or values 48 from sensors of the filter circuit 120. The feedback signals or values 46, 48 may be utilized in the disclosed impedance detection processing as well as for various motor control functions in operating the active front and rectifier 130 and/or the inverter 150 for driving the motor load 160 according to a desired speed, torque and/or other setpoint values and/or for operating the drive 110 during regenerative conditions.

The impedance value or values 50 provided by the impedance detection system 30 may be used for any suitable control purpose and/or diagnostic purposes in operation of the motor drive 110. Certain implementations may involve automatic detection of the impedance values of the filter inductor and capacitor components, individually or in groups, and the controller 160 may implement various diagnostic functionality, such as providing one or more base frequency signals or values 49 to the impedance detection system 30, obtaining corresponding impedance values 50 at corresponding frequency values 49, and comparing the estimated impedance(s) 50 with one or more threshold values or ranges, and issuing diagnostic messaging to connected supervisory control components of a distributed control system to initiate remedial action, and/or to modify or discontinue operation of the motor drive 110. For example, comparative analysis by the system 30 may indicate actual impedances of the inductors of the filter 120, as well as imbalance between these components by analyzing the inductors of different phases of the motor drive. Moreover, the impedance detection system and the above-described techniques can be used to detect inductor saturation during overload conditions. Moreover, the technique can be adjusted by changing the base frequency input signal 49 to estimate one or more system impedances at a selected frequency or at multiple frequencies. Thus, the system 30 can be used in motor drives 110 as well as in any application in which real-time impedance detection is useful.

As seen in FIG. 4, for example, the motor drive 110 and the controller 160 thereof may be connected by suitable communications connections to various other industrial control devices, possibly via a network, including communications connections to a programmable logic controller (PLC) 170 or other industrial control processor. Such communications may include the above-mentioned diagnostic reporting messaging indicating the estimated impedance values 50 at corresponding frequency values 49, as well as messaging indicating a specific electronic component 42 (e.g., inductor and/or capacitor of the filter circuit 120) that has an impedance value 50 outside an expected or desired range.

Other embodiments are possible, as seen in FIG. 4, in which the PLC 170 or other industrial control device operatively connected with the motor drive 110 implements a local impedance detection system 30 using a corresponding processor 172 and electronic memory 174 in order to provide estimated impedance values 50 as described above. In one possible implementation, the controller 160 of the motor drive 110 may send measured, estimated, or observed voltage and current values to the PLC 170 for use by the impedance detection system 130 in the PLC 170. In such a case, for example, the impedance detection system 30 in the PLC 170 may implement quadrature tracking filters 40 via the processor 172 (e.g., as seen in FIG. 3 above). In other variant implementations, one or more quadrature tracking filters 40 may be implemented within the motor drive 110 (whether as separate components or systems, or as part of the controller 160), with the controller 160 reporting the quadrature voltage and/or current values Vxα, Vxβ and/or Ixα, Ixβ (and possibly the corresponding frequency 49) to the impedance detection system 30 implemented in the PLC 170.

As further seen in FIGS. 5 and 6, moreover, electrical components 42 associated with multiple power phases may be jointly processed for impedance detection purposes using the above-described concepts. In the illustrated examples, one or more sensors, estimators and/or observers 44 are operatively connected with the components of interest, for example, providing the signals 46 and 48 corresponding to sensed voltages and/or currents of the LCL filter 120 directly or indirectly as inputs to one or more quadrature tracking filters 40 for generation of quadrature voltage and current values associated with each of the components of interest.

A conversion component 39 is provided in FIG. 5 in order to convert line-line voltage signals or values Vab, Vbc and Vca to line-neutral (or to line-ground) voltages 46a (Va), 46b (Vb) and 46c (Vc), which are then provided to voltage quadrature tracking filters 40. In this case, the current sensors for the corresponding power phases A, B and C in FIG. 4 may directly provide inductor current signals or values 48a, 48b and 48c to a set of three current quadrature tracking filters 40 and shown in FIG. 5 (e.g., without intermediate conversion components). In this manner, various conversions may be undertaken in order to provide input signals or values to the tracking filters 40 corresponding to the voltage across a particular electrical component 42 of interest as well as the current flowing through the component of interest for generation of corresponding quadrature values. In addition, in this example, a PLL circuit or system 52 assesses the fundamental AC input power frequency (e.g., via connection to the sensed voltage signals or values 46), and provides an output signal or value 49 to the quadrature tracking filters 40 to represent the base frequency $\omega_{base}$ for use in generating the quadrature values. FIG. 6 illustrates an alternative embodiment in which the sensors, estimators, observers 44 directly provide line-neutral or line-ground voltages 46a (Va), 46b (Vb) and 46c (Vc) to the voltage quadrature tracking filters 40. Moreover, a multiplier signal can be provided as an input to the PLL circuit 52 as shown in FIGS. 5 and 6, such as integer values 1, 2, 3, etc., whereby the component impedance values 50 are generated at various harmonics of the fundamental frequency.

In some embodiments, the quadrature tracking filters 40 may be replaced by a quadrature signal generator using a suitable transformer, such as a Hilbert transformer, or a transport delay block suitable for 90° shifting of the phase of the voltage or current signal or value provided as an input to generate the quadrature voltage or current outputs for use in the above described impedance computations. The tracking filters 40 or other suitable quadrature signal generating circuitry may generate the quadrature values Vaα, Vaβ, Iaα and Iaβ using any suitable algorithm which may output a quadrature pair of values. Furthermore, the quadrature tracking filters 40 may generate the quadrature values from a single-phase voltage or current input, or from an n-phase (any number of phases) voltage or current input, with or without intervening conversion components 39 as needed to assess the impedance values of a given electrical component 42 of interest. In certain embodiments, the quadrature tracking filters 40 may individually store or otherwise implement algorithms to perform either single input, multiple output quadrature tracking, or multiple input, multiple output quadrature tracking, depending on the inputs received. In some embodiments, the quadrature tracking filters 40 may include processing components for determining the appropriate algorithms to apply on the received measurements or estimates 46, 48, and/or the quadrature tracking filters 40 may include or otherwise implement processing components for applying all algorithms on the received inputs 46, 48.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method for automatically determining an impedance of an electrical component, the method comprising:
    obtaining quadrature voltage values and quadrature current values associated with the electrical component at a frequency of interest;
    using at least one processor, computing at least one impedance value of the electrical component at a frequency of interest based on the quadrature voltage and current values during real-time operation of a host system that includes the electrical component; and
    using the at least one processor, selectively initiating a remedial action, or modifying or discontinuing operation of the host system if the computed impedance value of the electrical component exceeds a threshold value;
    wherein obtaining the quadrature voltage values and quadrature current values comprises:
        generating the quadrature voltage values according to at least one detected voltage signal or value associated with the electrical component and according to a signal or value representing the frequency of interest using a first quadrature tracking filter, and
        generating the quadrature current values according to at least one detected current signal or value associated with the electrical component and according to the signal or value representing the frequency of interest using a second quadrature tracking filter.

2. The method of claim 1, further comprising providing the signal or value representing the frequency of interest using a phase locked loop.

3. The method of claim 1, wherein computing at least one impedance value of the electrical component at the frequency of interest comprises:
    using the at least one processor, computing estimated d-axis and q-axis current component values at least partially according to the quadrature current values and a voltage vector angle;
    using the at least one processor, computing an estimated impedance angle at least partially according to the estimated d-axis and q-axis current component values; and
    using the at least one processor, computing the at least one impedance value of the electrical component at least partially according to magnitudes of the quadrature voltage and current values and the estimated impedance angle.

4. The method of claim 3, wherein computing at least one impedance value of the electrical component at the frequency of interest comprises:
    using the at least one processor, computing a voltage magnitude value as a square root of a sum of squares of the quadrature voltage values;
    using the at least one processor, computing the voltage vector angle based on one of the quadrature voltage values and the voltage magnitude value; and
    using the at least one processor, computing a current magnitude value as a square root of a sum of squares of the quadrature current values.

5. The method of claim 1, comprising:
    converting at least one of the detected voltage signal or value and the detected current signal or value associated with the electrical component; and
    generating the corresponding quadrature current values according to the converted voltage or current signal or value.

6. The method of claim 1, comprising adjusting the signal or value representing the frequency of interest.

7. The method of claim 1, wherein computing at least one impedance value of the electrical component at the frequency of interest comprises:
    using the at least one processor, computing estimated d-axis and q-axis current component values at least partially according to the quadrature current values and a voltage vector angle;
    using the at least one processor, computing an estimated impedance angle at least partially according to the estimated d-axis and q-axis current component values; and
    using the at least one processor, computing the at least one impedance value of the electrical component at least partially according to magnitudes of the quadrature voltage and current values and the estimated impedance angle.

8. The method of claim 7, wherein computing at least one impedance value of the electrical component at the frequency of interest comprises:
    using the at least one processor, computing a voltage magnitude value as a square root of a sum of squares of the quadrature voltage values;
    using the at least one processor, computing the voltage vector angle based on one of the quadrature voltage values and the voltage magnitude value; and
    using the at least one processor, computing a current magnitude value as a square root of a sum of squares of the quadrature current values.

9. The method of claim 7, comprising:
    using the at least one processor, computing the estimated d-axis and q-axis current component values according to the following formula:

$$\begin{bmatrix} I_q^e \\ I_d^e \end{bmatrix} = \begin{bmatrix} \cos\theta & -\sin\theta \\ \sin\theta & \cos\theta \end{bmatrix} \begin{bmatrix} Ia\alpha \\ Ia\beta \end{bmatrix}$$

wherein $I_d^e$ is the estimated d-axis current component value, $I_q^e$ is the estimated q-axis current component value, $Ia\alpha$ and $Ia\beta$ are the quadrature current values, and $\theta$ is the voltage vector angle.

10. The method of claim 1, further comprising adjusting the frequency of interest.

11. An impedance detection system, comprising:
    an electronic memory;
    at least one sensor;
    at least one processor operatively coupled with the electronic memory and programmed to compute at least one impedance value of an electrical component at a frequency of interest based on quadrature voltage values and quadrature current values associated with the electrical component at the frequency of interest during real-time operation of a host system that includes the electrical component, the at least one processor being programmed to selectively initiate a remedial action or modify or discontinue operation of the host system if the computed impedance value of the electrical component exceeds a threshold value;

a first quadrature tracking filter operative to generate the quadrature voltage values according to at least one detected voltage signal or value associated with the electrical component and according to a signal or value representing the frequency of interest; and a second quadrature tracking filter operative to generate the quadrature current values according to at least one detected current signal or value associated with the electrical component and according to the signal or value representing the frequency of interest.

12. The impedance detection system of claim 11, comprising a phase locked loop operative to generate the signal or value representing the frequency of interest.

13. The impedance detection system of claim 11, wherein the at least one processor is programmed to:

computing estimated d-axis and q-axis current component values at least partially according to the quadrature current values and a voltage vector angle;

computing an estimated impedance angle at least partially according to the estimated d-axis and q-axis current component values; and computing the at least one impedance value of the electrical component at least partially according to magnitudes of the quadrature voltage and current values and the estimated impedance angle.

14. The impedance detection system of claim 13, wherein the at least one processor is programmed to:

compute a voltage magnitude value as a square root of a sum of squares of the quadrature voltage values;

compute the voltage vector angle based on one of the quadrature voltage values and the voltage magnitude value; and compute a current magnitude value as a square root of a sum of squares of the quadrature current values.

15. The impedance detection system of claim 11, wherein the at least one processor is integrated in a motor drive or an industrial control device.

16. A non-transitory computer readable medium with computer executable instructions for:

obtaining the quadrature voltage values and quadrature current values by:

generating the quadrature voltage values according to at least one detected voltage signal or value associated with an electrical component and according to a signal or value representing a frequency of interest using a first quadrature tracking filter, and generating the quadrature current values according to at least one detected current signal or value associated with the electrical component and according to the signal or value representing the frequency of interest using a second quadrature tracking filter;

receiving the quadrature voltage values and quadrature current values associated with the electrical component at the frequency of interest;

computing at least one impedance value of the electrical component at the frequency of interest based on the quadrature voltage and current values during real-time operation of a host system that includes the electrical component; and selectively initiating a remedial action, or modifying or discontinuing operation of the host system if the computed impedance value of the electrical component exceeds a threshold value.

17. The non-transitory computer readable medium of claim 16, comprising computer executable instructions for:

computing estimated d-axis and q-axis current component values at least partially according to the quadrature current values and a voltage vector angle;

computing an estimated impedance angle at least partially according to the estimated d-axis and q-axis current component values; and computing the at least one impedance value of the electrical component at least partially according to magnitudes of the quadrature voltage and current values and the estimated impedance angle.

18. The non-transitory computer readable medium of claim 17, comprising computer executable instructions for:

computing a voltage magnitude value as a square root of a sum of squares of the quadrature voltage values;

computing the voltage vector angle based on one of the quadrature voltage values and the voltage magnitude value; and computing a current magnitude value as a square root of a sum of squares of the quadrature current values.

* * * * *